(12) United States Patent
Rodriguez et al.

(10) Patent No.: US 11,664,239 B2
(45) Date of Patent: May 30, 2023

(54) LEAD FRAME FOR IMPROVING ADHESIVE FILLETS ON SEMICONDUCTOR DIE CORNERS

(71) Applicant: STMicroelectronics, Inc., Calamba (PH)

(72) Inventors: Rennier Rodriguez, Bulacan (PH); Maiden Grace Maming, Calamba (PH); Jefferson Talledo, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

(21) Appl. No.: 17/317,818

(22) Filed: May 11, 2021

(65) Prior Publication Data

US 2021/0265245 A1 Aug. 26, 2021

Related U.S. Application Data

(62) Division of application No. 16/264,824, filed on Feb. 1, 2019, now Pat. No. 11,037,864.

(60) Provisional application No. 62/636,332, filed on Feb. 28, 2018.

(51) Int. Cl.
*H01L 21/48* (2006.01)
*H01L 23/495* (2006.01)
*H01L 23/00* (2006.01)

(52) U.S. Cl.
CPC .... *H01L 21/4825* (2013.01); *H01L 23/49503* (2013.01); *H01L 23/49513* (2013.01); *H01L 23/49541* (2013.01); *H01L 23/49548* (2013.01); *H01L 23/562* (2013.01); *H01L 24/29* (2013.01)

(58) Field of Classification Search
CPC .......... H01L 23/49513; H01L 24/29; H01L 21/4825; H01L 23/562; H01L 23/49548; H01L 2224/8385; H01L 24/83; H01L 24/48; H01L 24/27; H01L 2224/73265; H01L 2224/92247; H01L 2224/48247; H01L 2224/27312; H01L 2224/2919; H01L 2224/26175; H01L 2224/32058; H01L 2224/32105; H01L 2224/32106; H01L 24/32; H01L 2224/27005; H01L 2224/2732; H01L 2224/29015; H01L 2224/29012; H01L 2224/29078; H01L 2224/29017; H01L 2224/32013; H01L 2224/83385; H01L 2224/83192; H01L 2224/32245; H01L 23/49503;
(Continued)

(56) References Cited

U.S. PATENT DOCUMENTS

| 5,214,307 A | 5/1993 | Davis |
| 2009/0072367 A1 | 3/2009 | Poddar et al. |
| 2009/0152691 A1 | 6/2009 | Nguyen et al. |

(Continued)

FOREIGN PATENT DOCUMENTS

| CN | 104332448 A | 2/2015 |
| EP | 1302983 A1 | 4/2003 |
| JP | 2007134394 A | 5/2007 |

*Primary Examiner* — Shouxiang Hu
(74) *Attorney, Agent, or Firm* — Seed IP Law Group LLP

(57) ABSTRACT

The present disclosure is directed to a lead frame including a die pad with cavities, and methods for attaching a semiconductor die to the lead frame. The cavities allow for additional adhesive to be formed on the die pad at the corners of the semiconductor die, and prevent the additional adhesive from overflowing on to active areas of the semiconductor die.

12 Claims, 9 Drawing Sheets

(58) Field of Classification Search
CPC . H01L 23/495; H01L 21/50; H01L 23/49541; H01L 23/49838; H01L 23/95
See application file for complete search history.

(56) References Cited

U.S. PATENT DOCUMENTS

| | | |
|---|---|---|
| 2009/0294932 A1 | 12/2009 | Sahasrabudhe et al. |
| 2012/0146192 A1 | 6/2012 | Han et al. |
| 2013/0020692 A1 | 1/2013 | Fujisawa |
| 2015/0235929 A1 | 8/2015 | Duca et al. |
| 2018/0190576 A1* | 7/2018 | Rodriguez .......... H01L 23/3114 |

* cited by examiner

LEAD FRAME FOR IMPROVING ADHESIVE FILLETS ON SEMICONDUCTOR DIE CORNERS

BACKGROUND

Technical Field

The present disclosure is directed to a lead frame and methods for attaching a semiconductor die to the lead frame.

Description of the Related Art

A semiconductor package typically includes a semiconductor die and a lead frame. The lead frame supports the semiconductor die and carries electrical signals between the semiconductor die and an external source, such as a printed circuit board (PCB). Generally, a semiconductor die is attached to a die pad of a lead frame by dispensing adhesive on to the die pad, and then placing the semiconductor die on the adhesive.

In order for the semiconductor die to be securely attached to the die pad, it is important to have a sufficient amount of adhesive joining the outer edges of the semiconductor die and the die pad together. Portions of the adhesive at the outer edges of the semiconductor die are often referred to as adhesive fillets. There are a variety of factors that may affect the formation of proper adhesive fillets, such as the placement accuracy of the semiconductor die on to the adhesive, a dispense pattern of the adhesive, the placement accuracy of the dispense pattern, and the surface properties of the lead frame (e.g., wettability). Without proper adhesive fillets between the outer edges of the semiconductor die and the die pad, the adhesive may delaminate. Consequently, the semiconductor die may detach from the die pad and/or be damaged.

Proper adhesive fillets are particularly important at the corners of the semiconductor die. The corners of the semiconductor die are points of high stress and will often detach from the die pad. Unfortunately, good adhesive fillets at the corners of the semiconductor die are difficult to achieve. Often, the adhesive fillets at the corners of the semiconductor die are very small or non-existent.

BRIEF SUMMARY

The present disclosure is directed to a lead frame, and methods for attaching a semiconductor die to the lead frame.

The lead frame includes a die pad, and cavities in the die pad. The semiconductor die is attached to the lead frame by forming adhesive on the die pad and in the cavities, and then placing the semiconductor die on the adhesive. The semiconductor die is positioned on the die pad such that each of the corners of the semiconductor die directly overlies or is otherwise aligned with a respective cavity.

The cavities allow additional adhesive to be formed at the corners of the semiconductor die, and, thus, improve the formation of large adhesive fillets at the corners. As a result, the strength of the adhesion between the die pad and the semiconductor die is improved. In addition, the cavities provide a receptacle for the additional adhesive to prevent the additional adhesive from overflowing on to active areas (e.g., a sensor, electrical circuit, electrical component, etc.) of the semiconductor die, and possibly damaging the active areas.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

Figure 1:
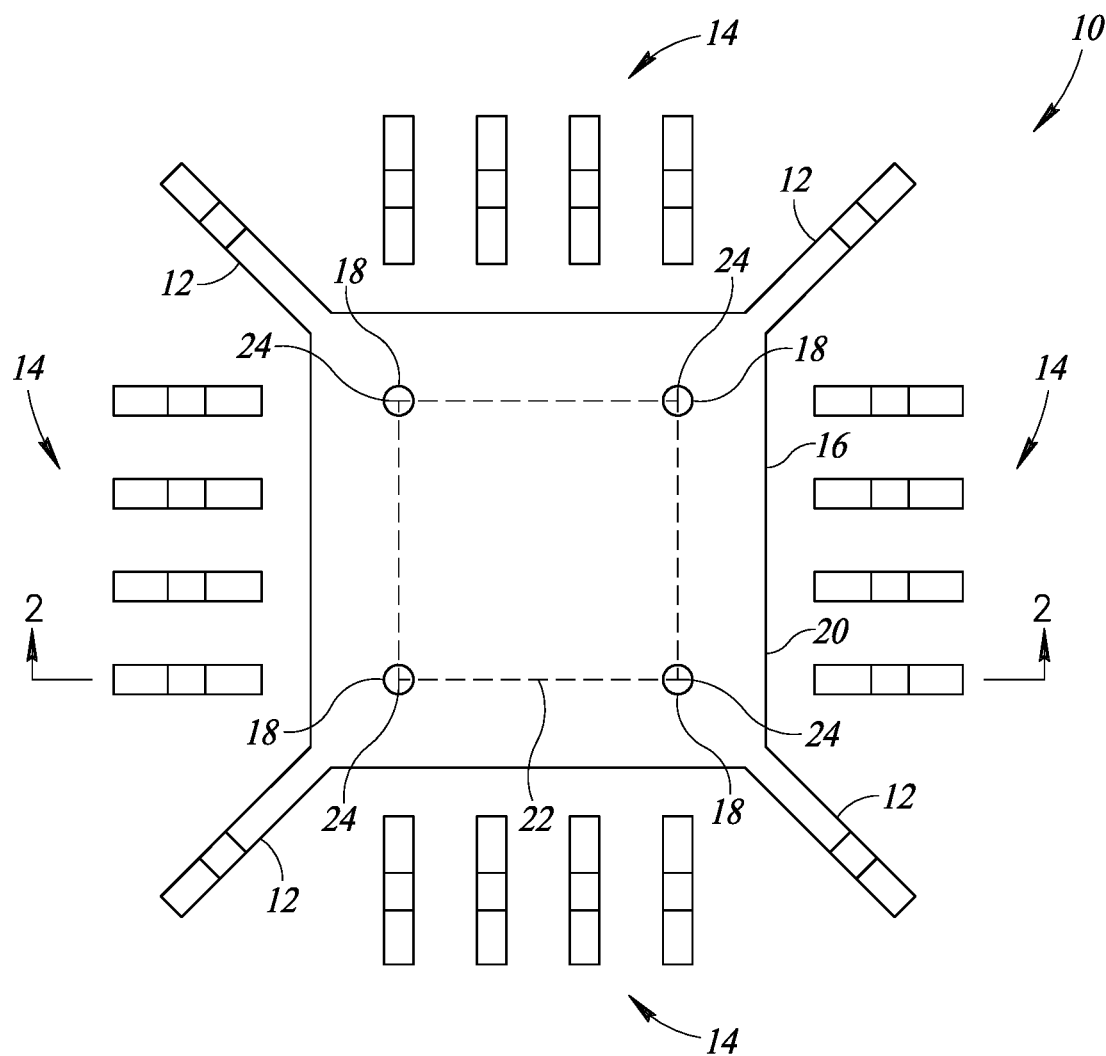
FIG. 1 is a plan view of a lead frame according to one embodiment disclosed herein.

In the following description, certain specific details are set forth in order to provide a thorough understanding of various aspects of the disclosed subject matter. However, the disclosed subject matter may be practiced without these specific details. In some instances, well-known structures and methods of manufacturing electronic devices have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting or glass substrates, whether or not the components are coupled together into a circuit or able to be interconnected. Throughout the specification, the term "layer" is used in its broadest sense to include a thin film, a cap, or the like, and one layer may be composed of multiple sub-layers.

It is noted that the dimensions set forth herein are provided as examples. Other dimensions are envisioned for this embodiment and all other embodiments of this application.

Current methods to improve the formation of adhesive fillets at the corners of the semiconductor die typically include dispensing a larger amount of adhesive on the die pad where the corners of the semiconductor die are positioned. However, such methods that simply increase the amount of adhesive are generally incompatible with semiconductor dice with exposed active areas (e.g., a sensor, electrical circuit, electrical component, etc.). When increasing the amount of adhesive at the corners of the semiconductor die, the adhesive will often overflow on to the active areas of the semiconductor die and cause the semiconductor die to malfunction. For example, the adhesive will often overflow from the die pad, along the side surfaces of the semiconductor die, and on to the active areas in an upper surface (i.e., the surface facing away from the die pad of the lead frame) of the semiconductor die. This problem is particularly common for thin semiconductor dice, as the additional adhesive may easily overflow on to the upper surface of the semiconductor die.

The present disclosure is directed to a lead frame and methods for attaching a semiconductor die to the lead frame. The lead frame includes a die pad with cavities that are positioned at the corners of the semiconductor die. The cavities allow for additional adhesive to be formed on the die pad at the corners of the semiconductor die, and prevent the additional adhesive from overflowing on to active areas of the semiconductor die. As a result, large adhesive fillets may be formed at the corners of the semiconductor die, and the adhesion between the semiconductor die and the lead frame is improved.

FIGS. 1 and 2, FIGS. 2 and 3, and FIGS. 5 and 6 are subsequent stages of a die attach process for attaching a semiconductor die to a lead frame according to one embodiment disclosed herein.

Figure 2:
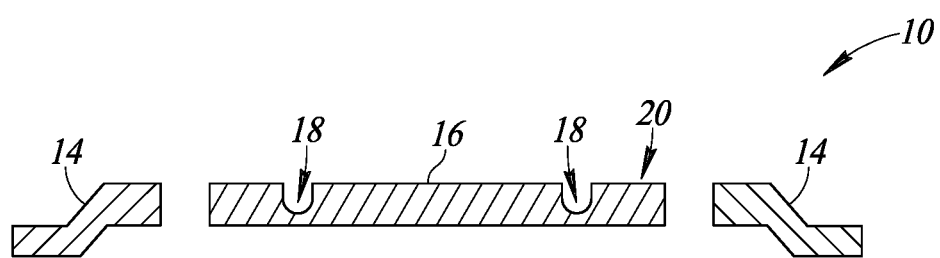
FIG. 2 is a cross-sectional view of the lead frame shown in FIG. 1 according to one embodiment disclosed herein.

FIG. 1 is a plan view of a lead frame 10 according to one embodiment disclosed herein. FIG. 2 is a cross-sectional view of the lead frame 10 along a line 2-2 shown in FIG. 1 according to one embodiment disclosed herein. It is beneficial to review FIGS. 1 and 2 together.

The lead frame 10 provides a platform for a semiconductor die 11; and carries electrical signals between the semiconductor die 11 and an external source, such as a printed circuit board (PCB). The attachment of the semiconductor die 11 to the lead frame 10 will be discussed in further detail with respect to FIGS. 5 and 6.

The lead frame 10 includes a plurality of supports or tie bars 12, a plurality of leads 14, and a die pad 16. The lead frame 10, including the supports 12, the leads 14, and the die pad 16, may be made of any type of conductive material. For example, the lead frame 10 may be made of steel, aluminum, copper, gold, or another type of conductive material. The lead frame 10 may be fabricated using standard fabrication techniques known or later developed. For example, the lead frame 10 may be formed by pattern deposition, a combination of blanket deposition and etching, or stamping a continuous conductive or metal sheet.

The supports 12 are coupled to and extend from corners of the die pad 16. The supports 12 are used to mount the die pad 16 to a substrate, such as a semiconductor substrate or a PCB. In one embodiment, the supports 12 and the die pad 16 are a single, contiguous piece.

The leads 14 surround the die pad 16. For example, as shown in FIG. 1, the leads 14 are positioned on each of the four sides of the die pad 16. The leads 14 are used to carry electrical signals between the semiconductor die 11, specifically an integrated circuit within the semiconductor diel 1, and an external source, such as a PCB. In one embodiment, the leads 14 are electrically coupled to the semiconductor die 11 by bonding wires that extend between the semiconductor die 11 and the leads 14.

It is noted that, although four leads are shown on each of the four sides of the die pad 16, the lead frame 10 may include any number of leads. Further, the leads may be arranged in a variety of different patterns. For example, the lead frame 10 may include 10, 20, or 30 leads on a single side, two sides, or three sides of the die pad 16.

The die pad 16 provides a platform for the semiconductor die 11. The die pad 16 includes cavities 18 or dimples that extend in to a surface 20 of the die pad 16. In one embodiment, the surface 20 of the die pad 16 is continuous except for the cavities 18 in the surface 20. Stated differently, the die pad 16 is planar except for the cavities 18. As best shown in FIG. 2, the cavities 18 extend partially in to the die pad 16, and do not extend all the way through the die pad 16. As will be discussed in further detail with respect to FIGS. 5 and 6, the cavities 18 ensure that there is a sufficient amount of adhesive dispensed at the corners of the semiconductor die 11, and that the adhesive does not overflow on to active areas of the semiconductor die 11.

In one embodiment, the cavities 18 are positioned to correspond with corners (i.e., where two adjacent sides of the semiconductor die 11 meet) of the semiconductor die 11, which will be mounted on the surface 20 of the die pad 16. For example, the dashed box 22 indicates a position of the semiconductor die 11 on the surface 20. As the semiconductor die 11, in this example, is rectangular in shape, each side of the semiconductor die 11 is positioned between and aligned with two of the cavities 18, and a respective cavity of the cavities 18 is positioned to directly underlie each of the four corners 24 of the semiconductor die 11. Stated differently, the semiconductor die 11 is positioned such that each of the corners 24 extends past an edge of the surface 20 of the die pad 16, and overhangs above the cavities 18. The position and attaching of the semiconductor die 11 to the die pad 16 will be discussed in further detail with respect to FIGS. 5 and 6.

In one embodiment, as shown in FIGS. 1 and 2, each of cavities 18 is rounded, such that the plan view of the cavities 18 shown in FIG. 1 are circular. However, other shapes are possible. For example, each of the cavities 18 may have an oval shape or an "L" shape from a plan view. The oval shaped and "L" shaped cavities will be discussed in further detail with respect to FIGS. 13 and 16.

Figure 3:
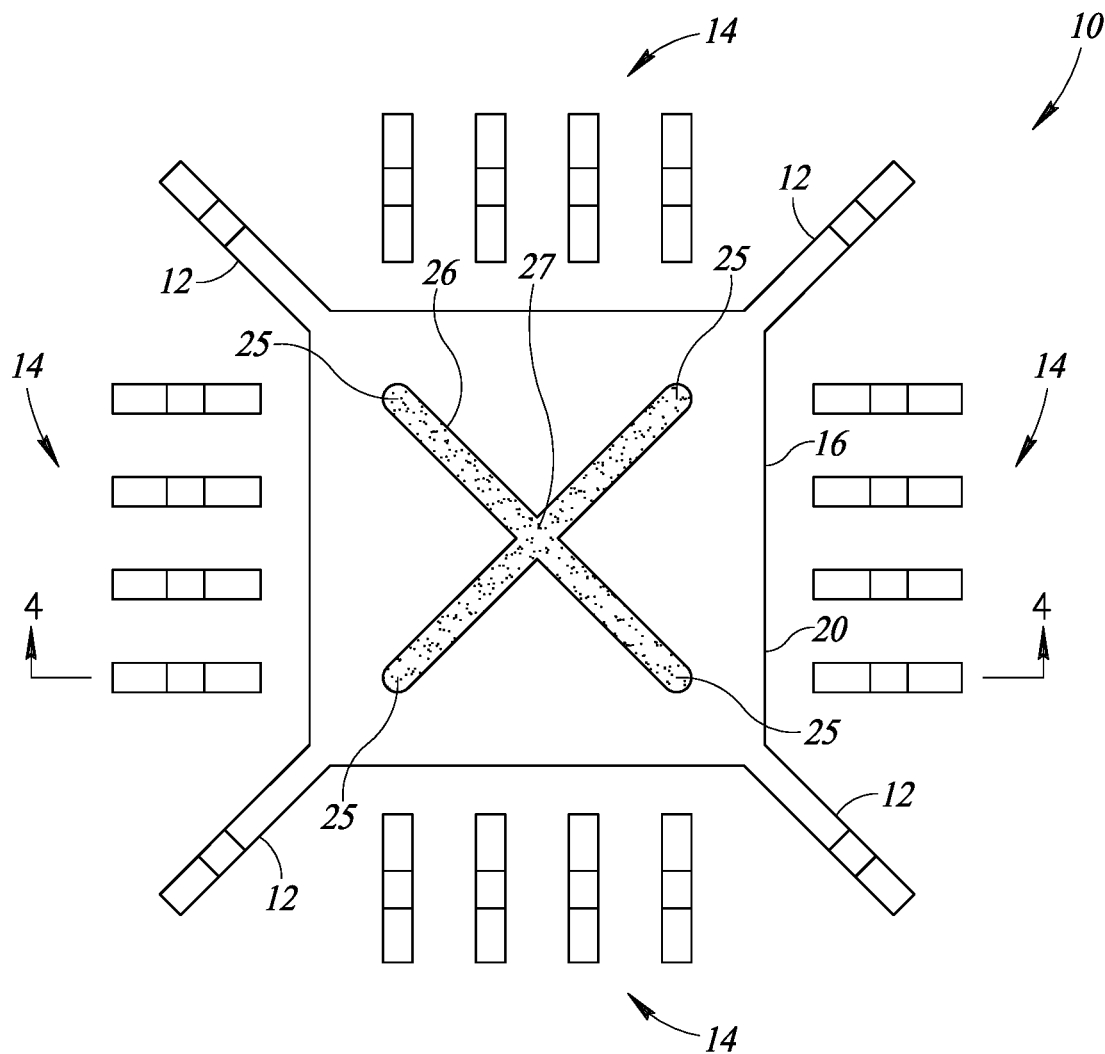
FIG. 3 is a plan view of adhesive formed on the lead frame of FIG. 1 according to one embodiment disclosed herein.
Figure 4:
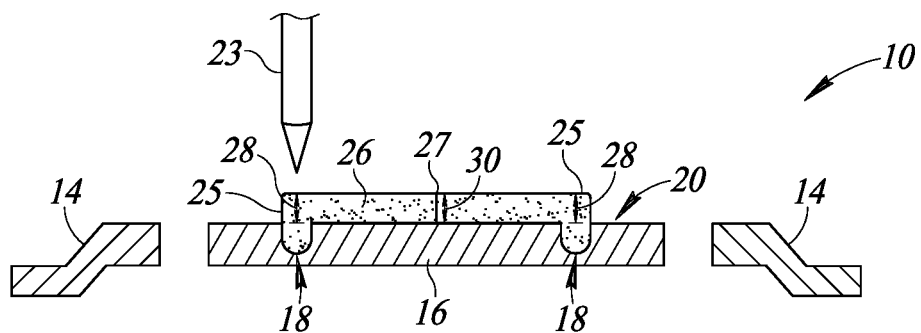
FIG. 4 is a cross-sectional view of the adhesive and the lead frame shown in FIG. 3 according to one embodiment disclosed herein.

The semiconductor die 11 is mounted to the surface 20 of the die pad 16 by forming a layer of adhesive on the surface 20, and placing the semiconductor die 11 on the adhesive. FIG. 3 is a plan view of adhesive or die attach material 26 formed on the lead frame 10 according to one embodiment disclosed herein. FIG. 4 is a cross-sectional view of the adhesive 26 and the lead frame 10 along a line 4-4 shown in FIG. 3 according to one embodiment disclosed herein. It is beneficial to review FIGS. 3 and 4 together. It is noted that the cross section shown in FIG. 4 shows portions of the adhesive 26 that are positioned a distance from the line 4-4 of FIG. 3, such as a center 27 of the adhesive 26.

The adhesive 26 is formed on the surface 20 and in the cavities 18 of the die pad 16. The adhesive 26 may be any type of adhesive material. In one embodiment, the adhesive 26 is epoxy.

The adhesive 26 may formed on the surface 20 in a variety of patterns. In one embodiment, as shown in FIG. 3, the adhesive 26 is formed on the surface 20 in a cross or "X" shaped pattern. Namely, the adhesive 26 extends between two of the cavities 18 that are diagonal from each other. The cross or "X" shaped pattern ensures that there is sufficient adhesive between the critical areas of the semiconductor die 11 and the die pad 16. Namely, the cross or "X" shaped pattern ensures that there is sufficient adhesive between the corners 24 and a center of the semiconductor die 11, and the die pad 16. Other adhesive patterns are also possible. For example, as will be discussed in further detail with respect to FIGS. 9 and 10, the adhesive 26 may be formed in each of the cavities 18 with a smaller cross or "X" shaped pattern that is surrounded by and spaced from the cavities 18.

In one embodiment, the adhesive 26 overfills the cavities 18 such that the adhesive 26 fills cavities 18, overflows out of the cavities 18, and extends past (i.e., above) the surface 20. As will be discussed in further detail with respect to FIGS. 5 and 6, the adhesive 26 is overfilled to ensure that a sufficient amount of adhesive is dispensed at the corners of the semiconductor die 11, and that the adhesive 26 does not overflow on to active areas of the semiconductor die 11.

In one embodiment, the cavities 18 are filled with the adhesive 26 such that the portions of the adhesive 26 that overflow out of the cavities 18 and extend past (i.e., above) the surface 20 have substantially the same thickness as portions of the adhesive 26 that are on the surface 20 (e.g., the center 27 of the adhesive 26). For example, as shown in FIG. 4, portions 25 of the adhesive 26 that directly overlie the cavities 18 and are above the surface 20 have a thickness 28. Said differently, the adhesive at cavities 18 has a first thickness in the cavity, between the surface 20 and a bottom of the cavity, and a second thickness 28 from the surface 20 to a top or outermost surface of the adhesive. Portions of the adhesive 26 that are on the surface 20 (e.g., the center 27 of the adhesive 26) have a thickness 30 that is substantially equal to the thickness 28. As will be discussed in further detail with respect to FIGS. 5 and 6, the substantially uniform thickness of the adhesive 26 allows the adhesive 26 to be evenly formed between the semiconductor die 11 and the surface 20 of the die pad 16.

In one embodiment, the adhesive 26 is formed on the surface 20 with an adhesive dispenser 23. The adhesive dispenser 23 scans across the surface 20 and dispenses the adhesive 26 on to the surface 20 and in to the cavities 18. To overfill the cavities 18 as discussed above, the adhesive dispenser 23 is delayed when the adhesive dispenser 23 directly overlies the cavities 18. Namely, when the adhesive dispenser 23 directly overlies the surface 20 (e.g., the center 27 of the adhesive 26), the adhesive dispenser 23 is held in the same position for a first time period before moving on, to ensure that the adhesive 26 has the thickness 30. When the adhesive dispenser 23 directly overlies the cavities 18 as shown, for example, in FIG. 4, the adhesive dispenser 23 is held above the cavities 18 for a second time period, which is greater than the first time period. Delaying the adhesive dispenser 23 over the cavities 18 ensures that the adhesive 26 fills the cavities 18 and has the thickness 28 above the cavities 18.

Figure 5:
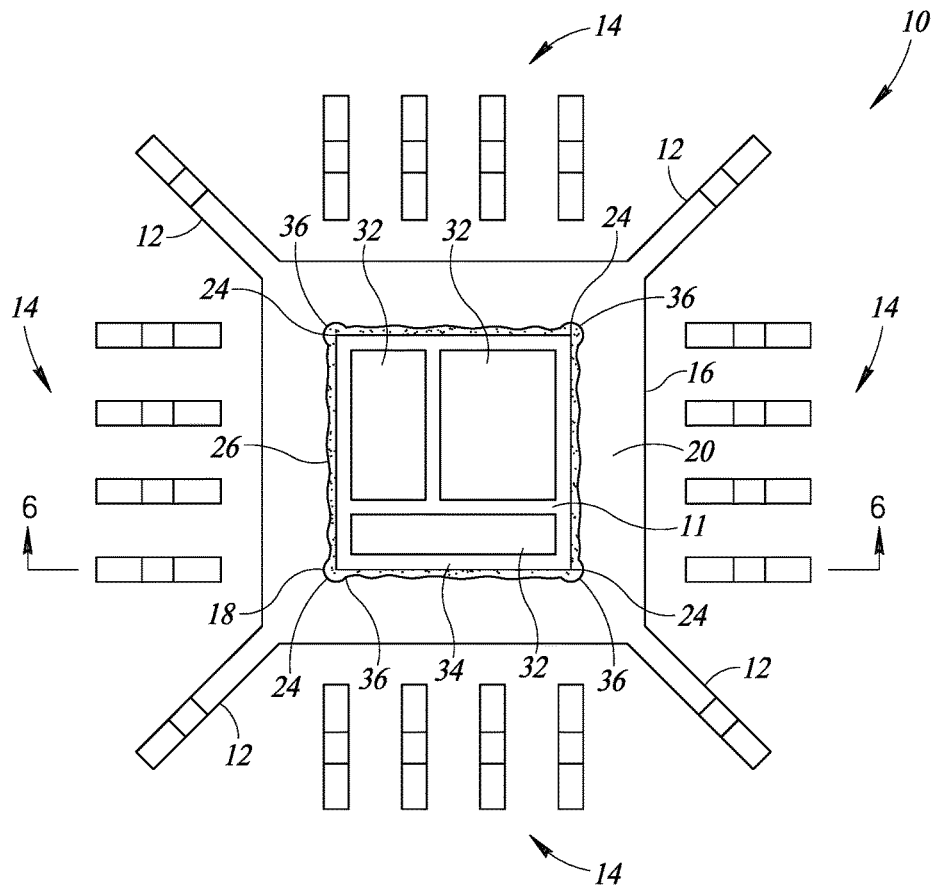
FIG. 5 is a plan view of a semiconductor die positioned on the adhesive and the lead frame of FIG. 3 according to one embodiment disclosed herein.
Figure 6:
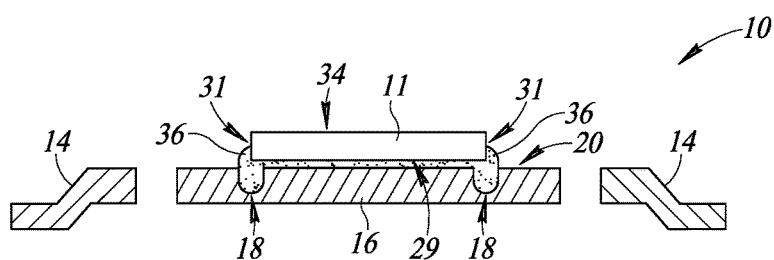
FIG. 6 is a cross-sectional view of the semiconductor die, the adhesive, and the lead frame shown in FIG. 5 according to one embodiment disclosed herein.
Figure 7:
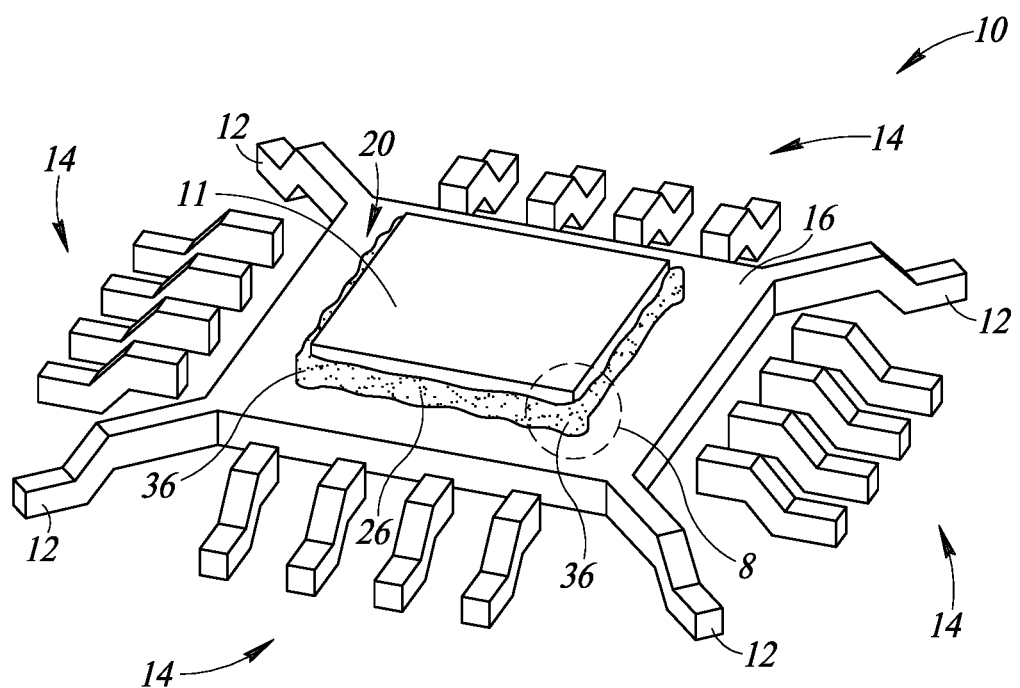
FIG. 7 is an angled, perspective view of the semiconductor die, the adhesive, and the lead frame shown in FIG. 5 according to one embodiment disclosed herein.
Figure 8:
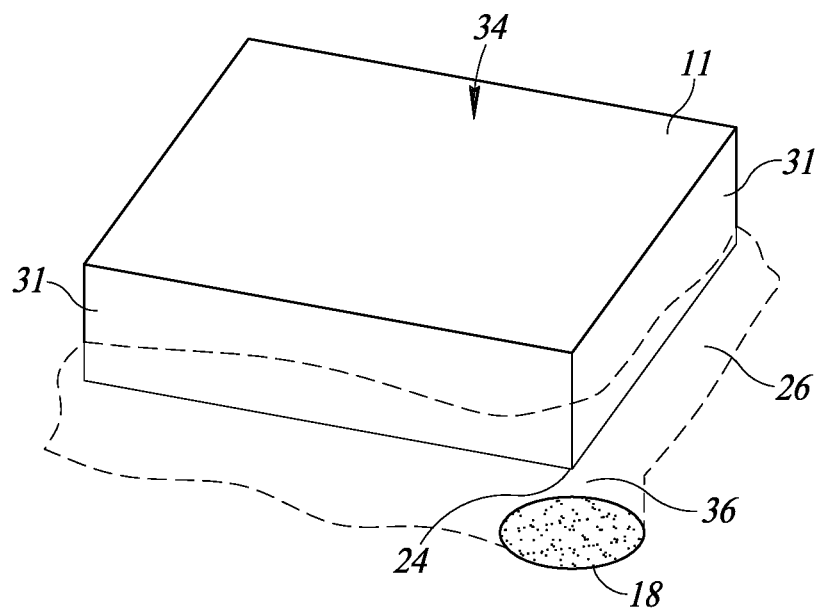
FIG. 8 is an enlarged view of the circled area shown in FIG. 7 according to one embodiment disclosed herein.

Once the adhesive 26 is formed on the surface 20 of the die pad 16, the semiconductor die 11 is placed on the adhesive 26 to attach the semiconductor die 11 to the die pad 16. FIG. 5 is a plan view of the semiconductor die 11 positioned on the adhesive 26 and the lead frame 10 according to one embodiment disclosed herein. FIG. 6 is a cross-sectional view of the semiconductor die 11, the adhesive 26, and the lead frame 10 along a line 6-6 shown in FIG. 5 according to one embodiment disclosed herein. It is noted that, in FIG. 6, the portion of the adhesive 26 that is formed between the cavities 18 and on the side surface of the semiconductor die 11 is removed to show the adhesive between the semiconductor die 11 and the surface 20. FIG. 7 is an angled, perspective view of the semiconductor die 11, the adhesive 26, and the lead frame 10 according to one embodiment disclosed herein. FIG. 8 is an enlarged view of the circled area shown in FIG. 7 according to one embodiment disclosed herein. It is beneficial to review FIGS. 5 to 8 together. The semiconductor die 11, the adhesive 26, and the lead frame 10 together may be considered to be a semiconductor package.

The semiconductor die 11 is attached to the die pad 16 by positioning the semiconductor die 11 on the adhesive 26. The semiconductor die 11 may be placed on the adhesive 26 using standard die attach processing techniques known or later developed. For example, the semiconductor die 11 may be placed on the adhesive 26 using a pick-and-place tool.

In one embodiment, the semiconductor die 11 is positioned on the die pad 16 such that each of the corners 24 of the semiconductor die 11 directly overlies a respective cavity of the cavities 18. Stated differently, each of the corners 24 extends past an edge of the surface 20 of the die pad 16, and overhangs above the cavities 18. For example, as shown in FIGS. 5 and 6, since the semiconductor die 11 is rectangular in shape, the four corners 24 of the semiconductor die 11 are aligned with each of the four cavities 18. In one embodiment, each of the corners 24 of the semiconductor die 11 is positioned at or near a center of a respective cavity of the cavities 18.

In one embodiment, the semiconductor die 11 includes a plurality of active areas 32. Each of the active areas 32 may be a sensor, an electrical circuit, a processor, an electrical component, or any other type of electronic device. In one embodiment, as shown in FIG. 5, the active areas 32 are formed in a surface 34 of the semiconductor die 11.

In one embodiment, when the semiconductor die 11 is placed on the adhesive 26 as shown in FIG. 3, a downward pressure (i.e., a pressure with a direction towards the surface 20 of the die pad 16) is applied to the semiconductor die 11 such that the adhesive 26 spreads between a surface 29 of the semiconductor die 11 and the surface 20 of the die pad 16. As discussed with respect to FIG. 4, the portions of the adhesive 26 that overflow out of the cavities 18 and extend past (i.e., above) the surface 20 have substantially the same thickness as portions of the adhesive 26 that are on the surface 20 (e.g., the center 27 of the adhesive 26). The substantially uniform thickness of the adhesive 26 allows the adhesive 26 to be spread evenly between the surface 29 of the semiconductor die and the surface 20 of the die pad 16 when the downward pressure is applied. In one embodiment, as best shown in FIG. 8, the adhesive 26 also spreads along side surfaces 31 of the semiconductor die 11 to form adhesive fillets along the edges, including the corners 24, of the semiconductor die 11. The spreading of the adhesive 26 and the forming the adhesive fillets provide a strong adhesion between the die pad 16 and the semiconductor die 11. It is noted the adhesive 26 may not always spread along the side surfaces 31. In some cases, the adhesive 26 may spread to form adhesive fillets at the corners 24 without forming adhesive fillets along one or more of the side surfaces 31.

As previously discussed, current methods to improve the formation of adhesive fillets at the corners of the semiconductor die typically include dispensing a larger amount of adhesive on the die pad where the corners of the semiconductor die are positioned. However, such methods are generally incompatible with semiconductor packages, particularly thin semiconductor packages, with exposed active areas, as the additional adhesive will often overflow on to active areas of the semiconductor die. The cavities 18 allow additional adhesive to be formed at the corners 24 of the semiconductor die 11. The additional adhesive improves the formation of large adhesive fillets 36 at the corners 24. Stated differently, as best shown in FIG. 8, the additional adhesive ensures that the adhesive 26 is formed at and on the corners 24, and the adhesive 26 extends away from the semiconductor die 11. As a result, the strength of the adhesion between the die pad 16 and the semiconductor die 11 is improved. In addition, the cavities 18 provide a receptacle for the additional adhesive to prevent the additional adhesive from overflowing on the active areas 32 of the semiconductor die 11. Namely, the additional adhesive will flow in to the cavities 18 rather than overflow on to the surface 34 of the semiconductor die 11. As a result, the additional adhesive is prevented from contaminating the active areas 32 and causing the active areas 32 to malfunction.

Once the semiconductor die 11 is attached to the die pad 16, the semiconductor die 11 is electrically coupled to the leads 14. In one embodiment, the semiconductor die 11 is electrically coupled to the leads 14 via a plurality of bond wires, with each of the bond wires extending from the semiconductor die 11 to a respective lead.

Figure 9:
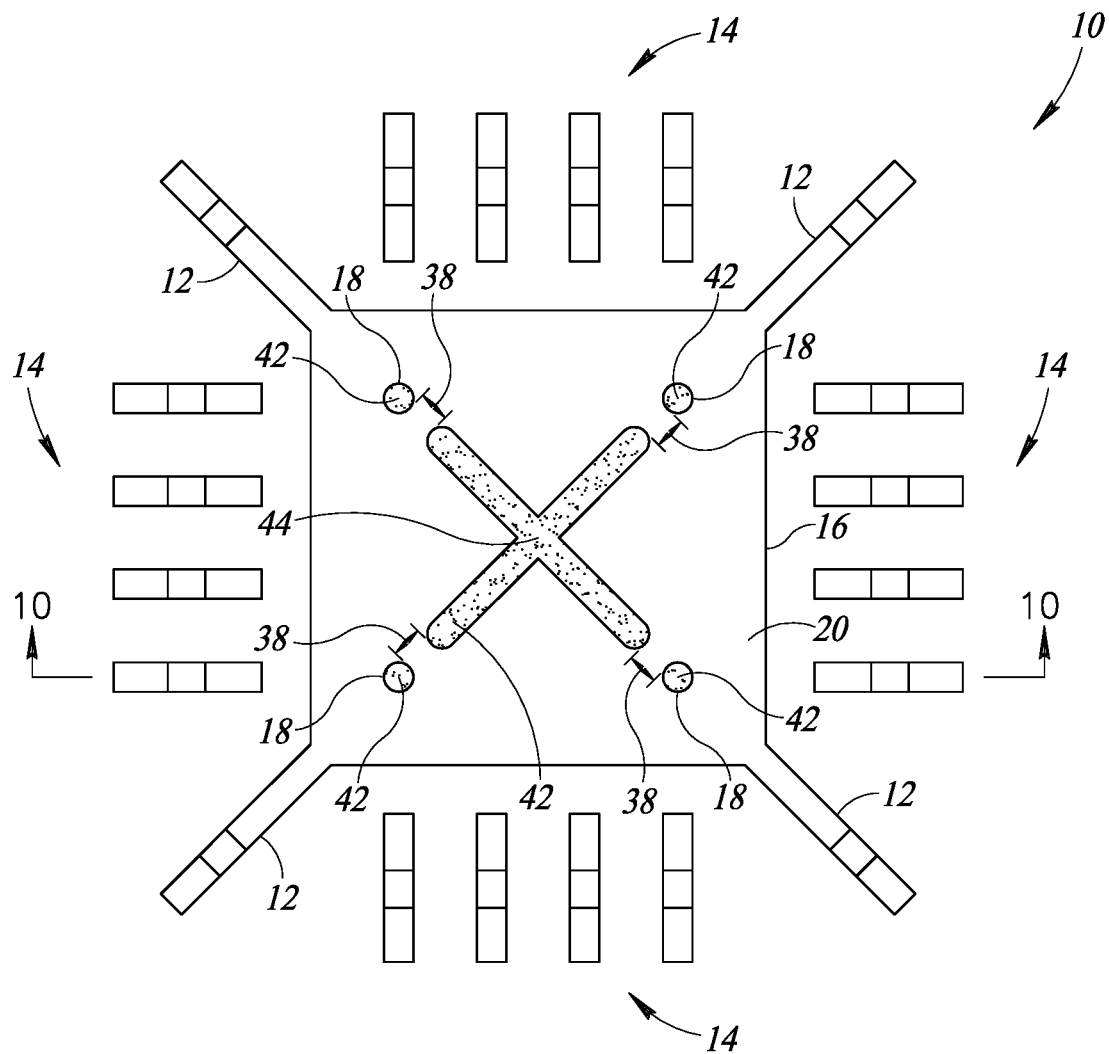
FIG. 9 is a plan view of adhesive formed on the lead frame of FIG. 1 according to another embodiment disclosed herein.
Figure 10:
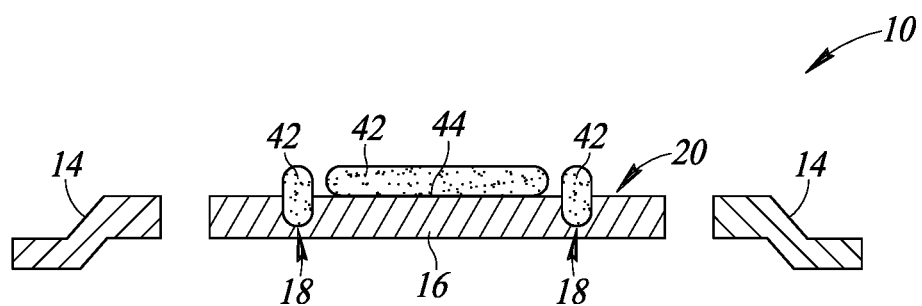
FIG. 10 is a cross-sectional view of the adhesive and the lead frame shown in FIG. 9 according to one embodiment disclosed herein.

As discussed with respect to FIG. 3, in one embodiment, the adhesive 26 is formed on the surface 20 of the die pad 16 in a cross or "X" shaped pattern. However, other adhesive patterns are possible. FIG. 9 is a plan view of an adhesive 42 formed on the lead frame 10 according to another embodiment disclosed herein. FIG. 10 is a cross-sectional view of the adhesive 42 and the lead frame 10 along a line 10-10 shown in FIG. 9 according to one embodiment disclosed herein. It is noted that the cross section shown in FIG. 10 shows portions of the adhesive 42 that are positioned a distance from the line 10-10, such as the center 44 of the adhesive 42.

Similar to the adhesive 26, the adhesive 42 is formed on the surface 20 and in the cavities 18 of the die pad 16. However, in contrast to the adhesive pattern shown in FIG. 3, the cross or "X" shaped portion of the adhesive 42 is spaced from the cavities 18 by a distance 38.

Figure 11:
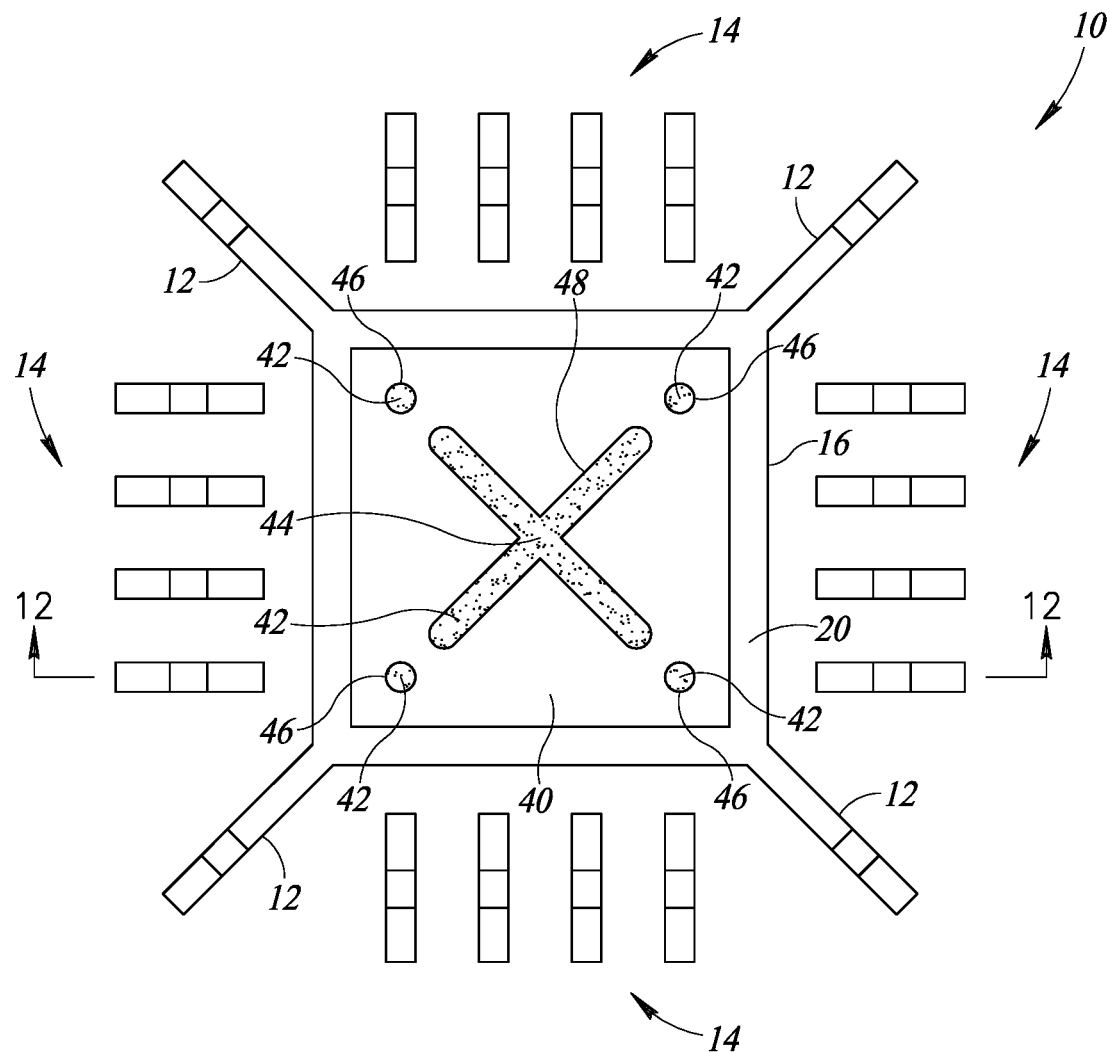
FIG. 11 is a plan view of adhesive formed on the lead frame of FIG. 1 using a stencil according to another embodiment disclosed herein.
Figure 12:
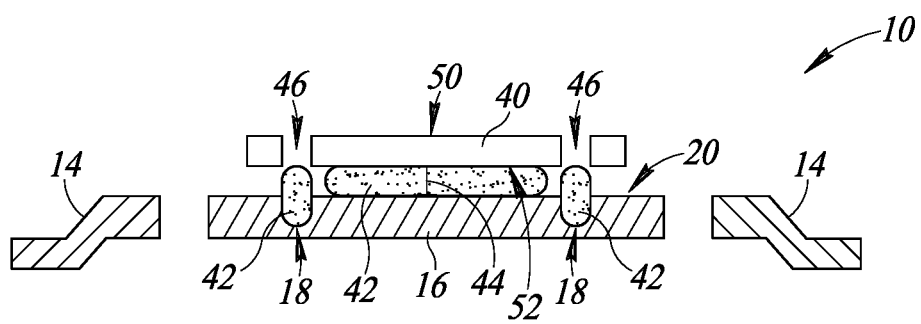
FIG. 12 is a cross-sectional view of the adhesive, the lead frame, and the stencil shown in FIG. 11 according to one embodiment disclosed herein.

The space between the cross or "X" shaped portion of the adhesive 26 and the cavities 18 decreases the total amount of adhesive formed on the die pad 16. As such, the adhesive pattern shown in FIGS. 11 and 12 is suitable for adhesives with low viscosity. Generally, adhesives with low viscosity are easily spreadable compared to adhesive with high viscosity, and, thus, less adhesive may be used to adhere the semiconductor die 11 to the die pad 16. In addition, using less adhesive decreases fabrication costs.

The space between the cross or "X" shaped portion of the adhesive 42 and the cavities 18 also further decreases the risk of the adhesive 42 at the corners 24 of the semiconductor die 11 (i.e., the adhesive formed in the cavities 18) overflowing on to the active areas 32 of the semiconductor die 11.

In one embodiment, similar to the adhesive 26, the adhesive 42 overfills the cavities 18 such that the adhesive 42 fills cavities 18, overflows out of the cavities 18, and extends past (i.e., above) the surface 20. In addition, in one embodiment, the cavities 18 are filled with the adhesive 42 such that the portions of the adhesive 42 that overflow out of the cavities 18 and extend past (i.e., above) the surface 20 have substantially the same thickness as portions of the adhesive 42 that are on the surface 20 (e.g., the center 44 of the adhesive 42).

FIG. 9 illustrates an embodiment where there are cavities 18 in the lead frame with a first portion of adhesive in the cavities and a second portion of adhesive in an area defined by the cavities. Various patterns are envisioned for the second portion of the adhesive. In one embodiment, the first portion has a first thickness that is greater than a second thickness of the second portion. The first portions are spaced from the second portions by a distance.

As discussed with respect to FIG. 4, in one embodiment, adhesive is formed on the surface 20 of the die pad 16 with an adhesive dispenser 23. In another embodiment, adhesive (e.g., the adhesive 26 and the adhesive 42) is formed on the surface 20 using a stencil. FIG. 11 is a plan view of the adhesive 42 formed on the lead frame 10 using a stencil 40 according to another embodiment disclosed herein. FIG. 12 is a cross-sectional view of the adhesive 42, the lead frame 10, and the stencil 40 along a line 12-12 shown in FIG. 11 according to one embodiment disclosed herein. It is noted that the cross section shown in FIG. 12 shows portions of the adhesive 42 that are positioned a distance from the line 10-10, such as the center 44 of the adhesive 42.

The stencil 40 includes apertures that are arranged in the same pattern as the adhesive 42. Namely, the stencil 40 includes four circular apertures 46 that have the same diameter as the cavities 18, and a cross or "X" shaped aperture 48 between the circular apertures 46.

The stencil 40 is overlaid above the surface 20 of the die pad 16 with the four circular apertures 46 being aligned with the cavities 18. For example, as shown in FIG. 12, the stencil 40 is positioned above the surface 20 such that the circular apertures 46 directly overlie the cavities 18.

Once the stencil 40 is overlaid above the surface 20 of the die pad 16, the adhesive 42 is dispensed by spreading the glue through the stencil 40. Namely, the adhesive 42 is dispensed from a first side 50 of the stencil 40, through the circular apertures 46 and the cross or "X" shaped aperture 48, to a second side 52 of the stencil 40, and on to the surface 20, where the adhesive 42 is formed in the pattern as shown in FIG. 9.

Although the stencil 40 is discussed with respect to forming the adhesive 42, a stencil may also be used to form the adhesive 26 shown in FIGS. 3 and 4.

As discussed with respect to FIGS. 1 and 2, in one embodiment, each of the cavities 18 is circular. However, larger cavities with different shapes are also possible.

Figure 13:
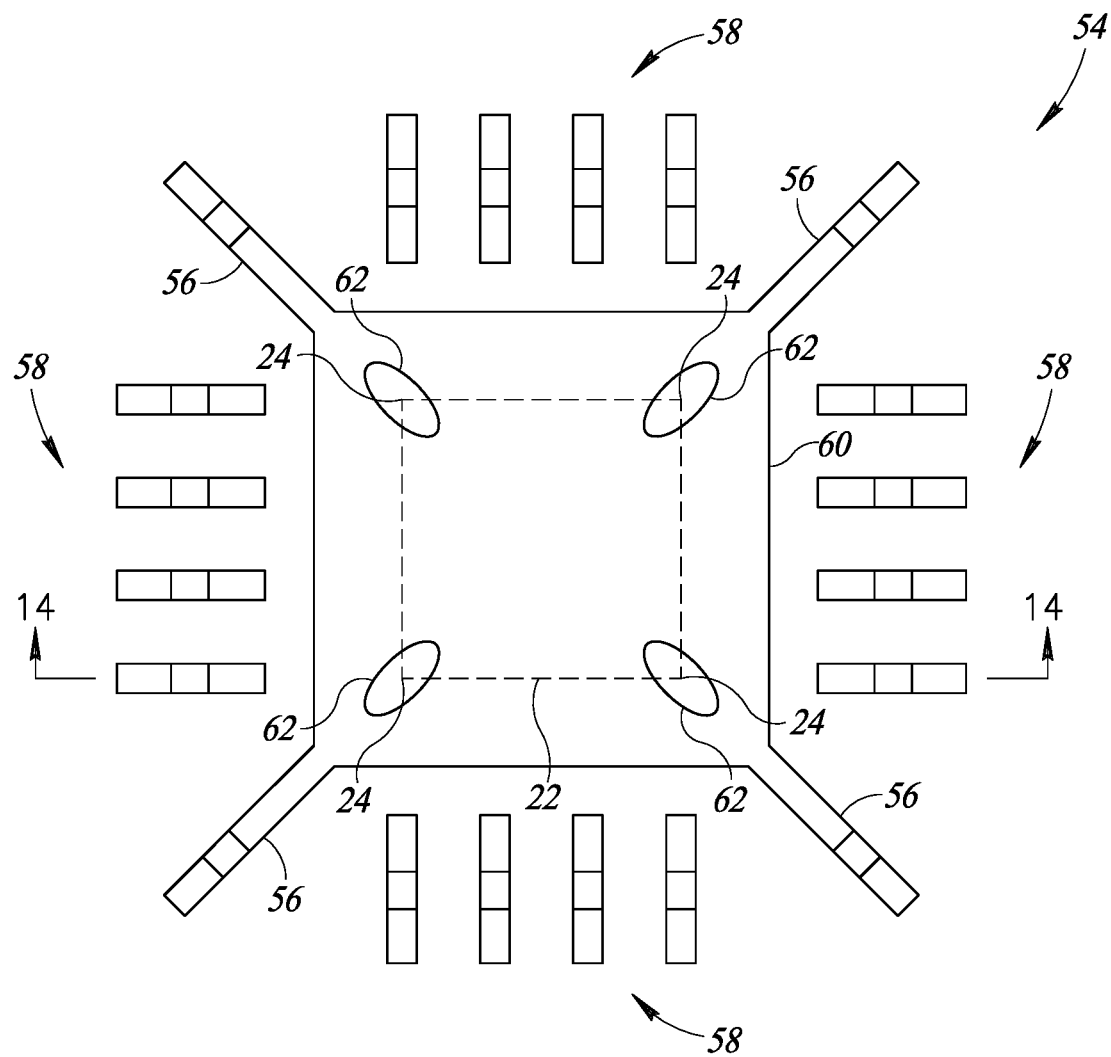
FIG. 13 is a plan view of a lead frame according to another embodiment disclosed herein.
Figure 14:
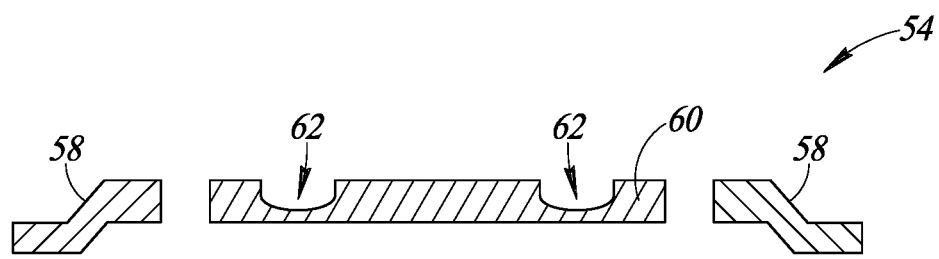
FIG. 14 is a cross-sectional view of the lead frame shown in FIG. 13 according to one embodiment disclosed herein.

FIG. 13 is a plan view of a lead frame 54 according to another embodiment disclosed herein. FIG. 14 is a cross-sectional view of the lead frame 54 along a line 14-14 shown in FIG. 13 according to one embodiment disclosed herein. It is beneficial to review FIGS. 13 and 14 together.

Similar to the lead frame 10, the lead frame 54 includes a plurality of supports 56, a plurality of leads 58, and a die pad 60. However, the sizes of cavities 62 in the die pad 60 are larger than the cavities 18, and the plan view of the cavities 62 shown in FIG. 13 are oval. In one embodiment, as shown in FIG. 13, each of the cavities 62 extends lengthwise towards a center of the die pad 60.

The cavities 62 allow an increased amount of adhesive to be formed in the cavities 62 and at the corners 24 of the semiconductor die 11. The additional adhesive improves the formation of adhesive fillets at the corners 24 and, thus, increases the strength of the adhesion between the die pad 60 and the semiconductor die 11. In one embodiment, each corner of the die is aligned within a wider portion of the oval, closer to a center point of the oval than a boundary of the oval.

Figure 15:
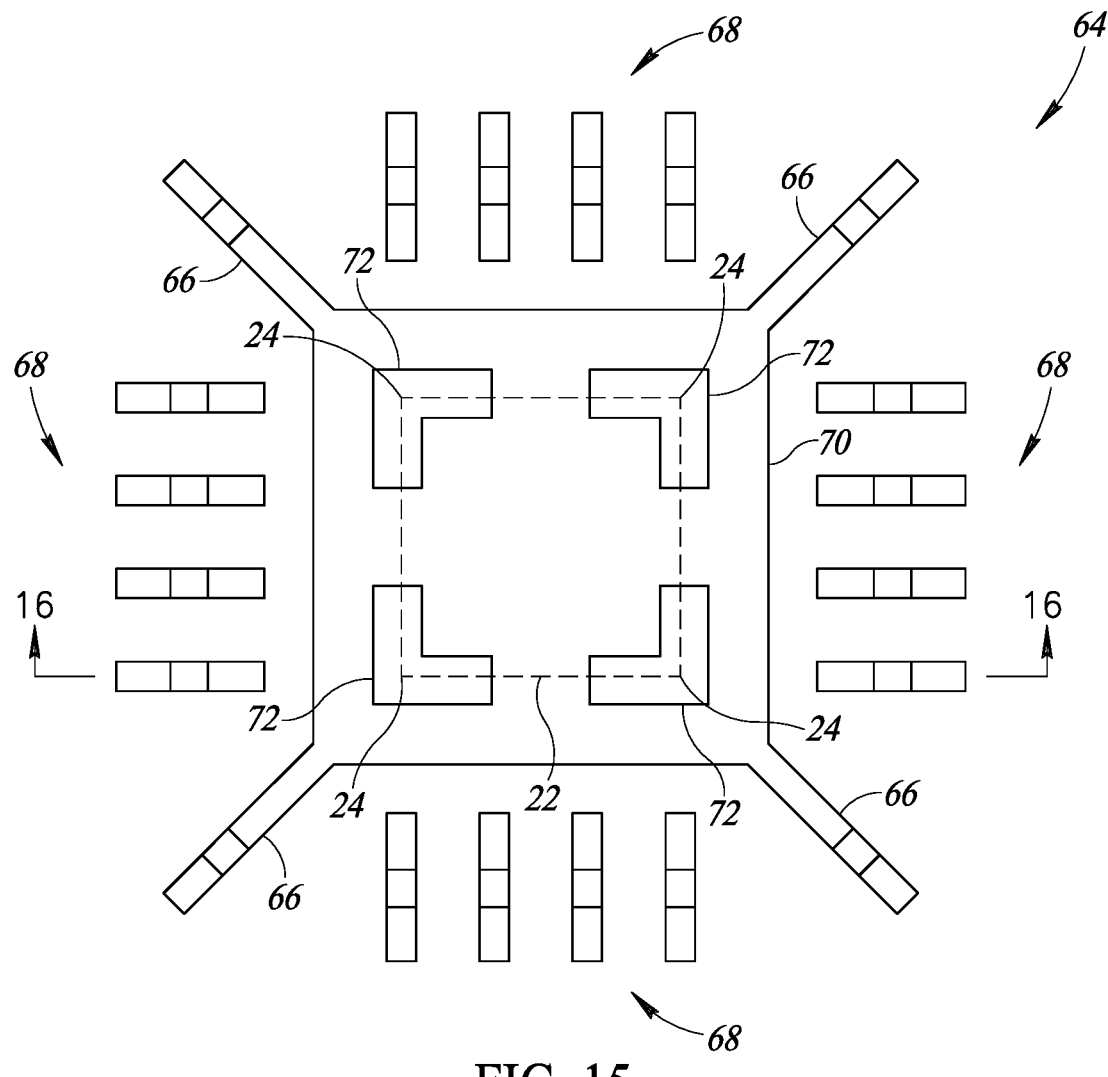
FIG. 15 is a plan view of a lead frame according to another embodiment disclosed herein.
Figure 16:
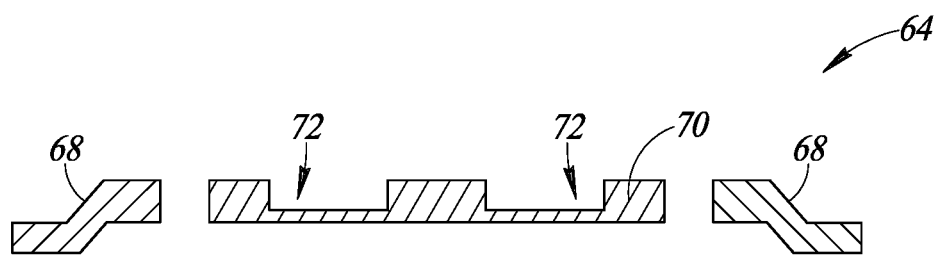
FIG. 16 is a cross-sectional view of the lead frame shown in FIG. 15 according to one embodiment disclosed herein.

FIG. 15 is a plan view of a lead frame 64 according to another embodiment disclosed herein. FIG. 16 is a cross-sectional view of the lead frame 64 along a line 16-16 shown in FIG. 15 according to one embodiment disclosed herein. It is beneficial to review FIGS. 15 and 16 together.

Similar to the lead frame 10, the lead frame 64 includes a plurality of supports 66, a plurality of leads 68, and a die pad 70. However, the sizes of cavities 72 in the die pad 70 are larger than the cavities 18, and the plan view of the cavities 72 shown in FIG. 15 are "L" shaped. In one embodiment, as shown in FIG. 15, each of the cavities 72 includes a first portion that extends along a first side of the die pad 70, and a second portion that extends along a second side, which is adjacent to the first side, of the die pad 70.

Similar to the cavities 62 shown in FIGS. 13 and 14, the cavities 72 allow an increased amount of adhesive to be formed in the cavities 72 and at the corners 24 of the semiconductor die 11. The additional adhesive improves the formation of large adhesive fillets at the corners 24 and, thus, increases the strength of the adhesion between the die pad 70 and the semiconductor die 11.

The alternative embodiment in FIG. 15 can be formed with a different type of etch or removal technique in that instead of curved or rounded edges, the edges may be more rectangular. While illustrated as L-shaped, these rectangular cavities may have a variety of shapes. Each cavity has a volume, and the edge of the die is aligned within each volume. Each cavity has edges or walls and the edges of the die are positioned within the edges or walls of the cavity.

The lead frames shown in FIGS. 1 to 16 are shown with a downset configuration. Namely, the supports 12 and the leads 14 are multi-level (i.e., each include a first portion, and a second portion higher than the first portion) to raise the die pad. In these embodiments, the entire die pad will be encapsulated by a molding compound when packaged, and at least one surface of the leads will be left exposed. For example, referring to FIG. 6, both the upper surface 20 and the lower surface (i.e., the surface opposite to the surface 20) of the die pad 16 will be covered with a molding compound, and the leads 14 will be left exposed. However, a die pad with cavities as discussed with respect to FIGS. 1 to 16 may be used in conjunction with other types of lead frame packages. For example, the die pad 16 with the cavities 18 shown in FIGS. 5 and 6 may be used in leadless semiconductor packages.

Figure 17:
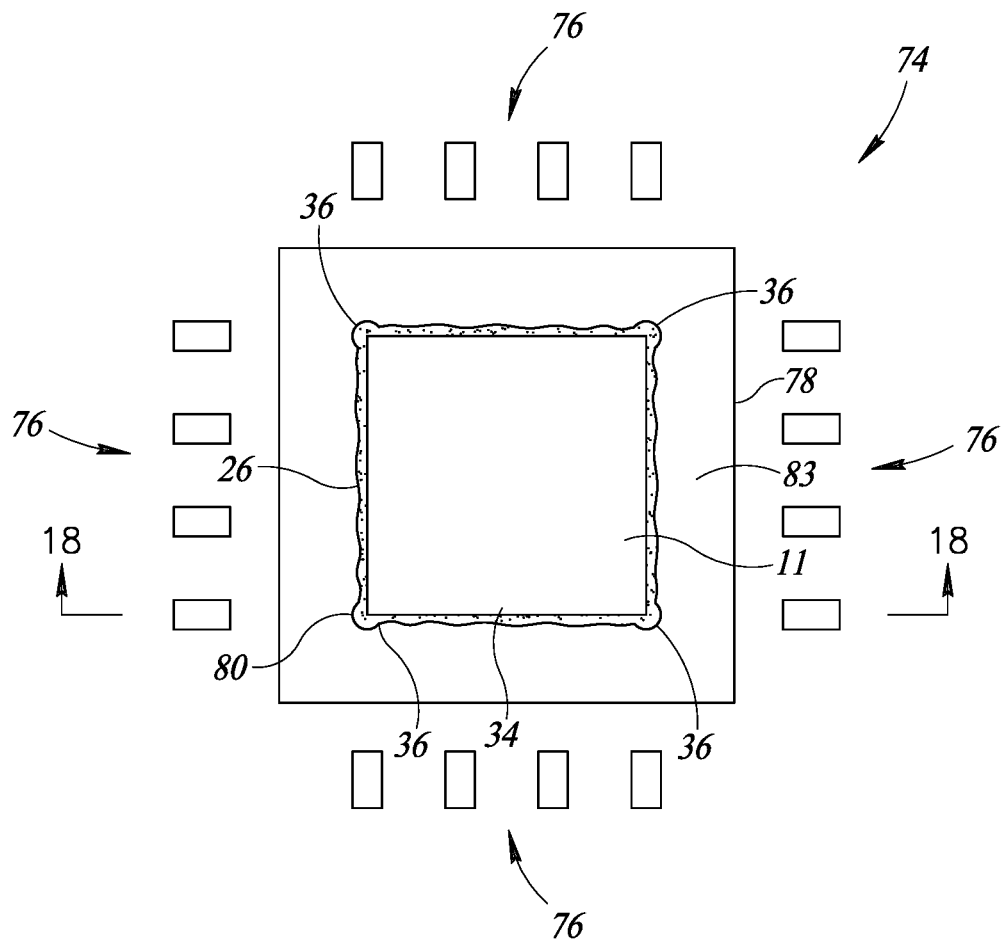
FIG. 17 is a plan view of a semiconductor die positioned on adhesive and a lead frame according to another embodiment disclosed herein.
Figure 18:
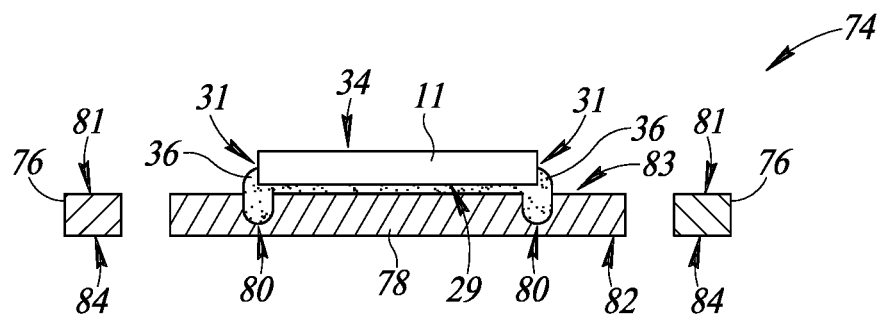
FIG. 18 is a cross-sectional view of the semiconductor die, the adhesive, and the lead frame shown in FIG. 17 according to one embodiment disclosed herein.

FIG. 17 is a plan view of the semiconductor die 11 positioned on adhesive 26 and a lead frame 74 according to another embodiment disclosed herein. FIG. 18 is a cross-sectional view of the semiconductor die 11, the adhesive 26, and the lead frame 74 shown in FIG. 17 according to one embodiment disclosed herein. In contrast to the lead frame 10, the lead frame 74 is used in, for example, a quad-flat no-leads (QFN) package.

Similar to the lead frame 10, the lead frame 74 includes a plurality of leads 76 and a die pad 78, and the die pad 78 includes cavities 80. The die pad 78 and the cavities 80 are substantially similar to the die pad 16 and the cavities 18. However, in contrast to the lead frame 10, the lead frame 74 does not have a downset configuration. Namely, the lead frame 74 does not include supports or tie bars attached to the die pad 78, and the leads 76 are not multi-level (i.e., the leads 76 are planar). In this embodiment, upper surfaces of the die pad 78 and the leads 76 will be encapsulated by a molding compound when packaged, and lower surfaces of the die pad 78 and the leads 76 will be left exposed. For example, referring to FIG. 18, surfaces 81 of the leads 76 and a surface 83 of the die pad 78 will be covered with a molding compound, and surfaces 84 of the leads and a surface 82 of the die pad 78 will be left exposed.

The various embodiments provide a lead frame including a die pad with cavities, and methods for attaching a semiconductor die to the lead frame. The cavities are positioned at the corners of the semiconductor die, and allow additional adhesive to be formed at the corners of the semiconductor die. As a result of the additional adhesive, large adhesive fillets are formed at the corners of the semiconductor die, and the adhesion between the semiconductor die and the lead frame is improved. Further, the cavities prevent the additional adhesive from overflowing on to active areas of the semiconductor die.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming adhesive on a surface of a die pad, and in a plurality of cavities that extend into the surface of the die pad, the forming of the adhesive including:
      forming a plurality of first adhesives that are in the plurality of cavities, respectively, and separated from each other; and
      forming second adhesive on a center portion of the surface of the die pad and separated from the plurality of first adhesives, the second adhesive including first and second portions in a cross-shaped pattern, the first portion extends between and is spaced from first and second cavities of the plurality of cavities, the second portion extends between and is spaced from third and fourth cavities of the plurality of cavities; and
   positioning a die on the adhesive, the die including a plurality of corners, each of the plurality of corners overlying a respective cavity of the plurality of cavities.

2. The method of claim 1 wherein the first and second cavities are aligned in a first direction, and the first and third cavities are aligned in a second direction that is substantially perpendicular to the first direction.

3. The method of claim 1 wherein each of the plurality of cavities has an oval shape or an L shape.

4. The method of claim 1 wherein the surface of the die pad is continuous except for the plurality of cavities.

5. The method of claim 1 wherein the forming of the adhesive includes overfilling the plurality of cavities such that the adhesive overflows from the plurality of cavities.

6. The method of claim 5 wherein each of the first, second, third, and fourth dimples includes a first portion that extends in the first direction, and a second portion that extends in the second direction.

7. A method, comprising:
dispensing adhesive on a surface of a die pad,
the die pad including a first dimple, a second dimple, a third dimple, and a fourth dimple extending into the surface of the die pad,
the first dimple being aligned with the second dimple in a first direction and aligned with the third dimple in a second direction transverse to the first direction,
the second dimple being aligned with the fourth dimple in the second direction,
the third dimple being aligned with the fourth dimple in the first direction,
the surface of the die pad being continuous except for the first, second, third, and fourth dimples,
the dispensing of the adhesive including:
dispensing first, second, third, and fourth adhesives in the first, second, third, and fourth dimples, respectively; and
dispensing a fifth adhesive that is spaced from the first, second, third, and fourth adhesives, the fifth adhesive including first and second portions in a cross shaped pattern, the first portion extends between and is spaced from the first and fourth dimples, the second portion extends between and is spaced from the second and third dimples; and positioning a die on the adhesive.

8. The method of claim 7 wherein the die includes a first corner, a second corner, a third corner, and a fourth corner that overlie the first, second, third, and fourth dimples, respectively.

9. The method of claim 7 wherein each of the first, second, third, and fourth dimples has an oval shape and a longitudinal axis extending towards a center portion of the die pad.

10. A method, comprising:
forming adhesive on a surface of a die pad,
the die pad including first, second, third, and fourth dimples extending into the surface of the die pad,
the forming of the adhesive including:
forming first, second, third, and fourth adhesives in the first, second, third, and fourth dimples, respectively; and
forming a fifth adhesive in a cross shaped pattern such that a first portion of the fifth adhesive extends between the first and second dimples along a first direction and a second portion of the fifth adhesive extends between the third and fourth dimples along a second direction transverse to the first direction, the fifth adhesive being spaced from the first, second, third, and fourth adhesives and the first, second, third, and fourth dimples; and
positioning a die on the adhesive.

11. The method of claim 10 wherein the first portion of the fifth adhesive intersects the second portion of the fifth adhesive at a central portion of the surface of the die pad.

12. The method of claim 10 wherein the positioning of the die includes positioning the die such that first, second, third, and fourth corners of the die directly overlie the first, second, third, and fourth dimples, respectively.

* * * * *